(12) United States Patent
Leirer et al.

(10) Patent No.: US 10,665,758 B2
(45) Date of Patent: May 26, 2020

(54) COMPONENT HAVING A METAL CARRIER AND METHOD FOR PRODUCING COMPONENTS

(71) Applicant: OSRAM OLED GmbH, Regensburg (DE)

(72) Inventors: Christian Leirer, Friedberg (DE); Thomas Schwarz, Regensburg (DE); Lutz Höppel, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/747,188

(22) PCT Filed: Jul. 14, 2016

(86) PCT No.: PCT/EP2016/066810
§ 371 (c)(1),
(2) Date: Jan. 24, 2018

(87) PCT Pub. No.: WO2017/016892
PCT Pub. Date: Feb. 2, 2017

(65) Prior Publication Data
US 2018/0219135 A1      Aug. 2, 2018

(30) Foreign Application Priority Data
Jul. 28, 2015   (DE) .................. 10 2015 112 280

(51) Int. Cl.
*H01L 33/62* (2010.01)
*H01L 33/48* (2010.01)
(Continued)

(52) U.S. Cl.
CPC ............ *H01L 33/486* (2013.01); *H01L 33/30* (2013.01); *H01L 33/44* (2013.01); *H01L 33/62* (2013.01);
(Continued)

(58) Field of Classification Search
None
See application file for complete search history.

(56) References Cited

U.S. PATENT DOCUMENTS

| 7,329,905 B2 | 2/2008 | Ibbetson et al. |
| 7,719,024 B2 | 5/2010 | Bando |
(Continued)

FOREIGN PATENT DOCUMENTS

| DE | 10159695 A | 6/2003 |
| DE | 102009032486 A1 | 1/2011 |
(Continued)

OTHER PUBLICATIONS

Rasant-Alcotec, "Galvano-Aluminium," http://www.aluminiumplating.com/schichteigenschaften/aluminiumschichten, downloaded Jan. 17, 2018, 1 page.

*Primary Examiner* — Benjamin P Sandvik
(74) *Attorney, Agent, or Firm* — Slater Matsil, LLP

(57) ABSTRACT

A component having a metal carrier and a method for producing a component are disclosed. In an embodiment the component includes a carrier having a metallic carrier layer, an insulating layer and a first through-contact extending in a vertical direction throughout the carrier layer, wherein the through-contact is electrically isolated from the carrier layer via the insulating layer. The component further includes a semiconductor body and a wiring structure arranged in the vertical direction between the carrier and the semiconductor body at least places and electrically contacting the semiconductor body, wherein the wiring structure has a first connection area and a second connection area, wherein the connection areas adjoin the carrier and are assigned to different electrical polarities of the component, wherein the first through-contact is in electrical contact with one of the
(Continued)

connection areas, and wherein the component is configured to be externally electrically connectable via the carrier.

19 Claims, 10 Drawing Sheets

(51) Int. Cl.
 H01L 33/30 (2010.01)
 H01L 33/44 (2010.01)
(52) U.S. Cl.
 CPC ... *H01L 2224/11* (2013.01); *H01L 2933/0025* (2013.01); *H01L 2933/0066* (2013.01)

(56) References Cited

U.S. PATENT DOCUMENTS

| | | | |
|---|---|---|---|
| 8,212,271 B2 | 7/2012 | Kotani et al. | |
| 8,482,026 B2 | 7/2013 | Höppel et al. | |
| 8,637,893 B2 | 1/2014 | Kim | |
| 8,698,178 B2 | 4/2014 | Höppel et al. | |
| 8,729,564 B2 | 5/2014 | Kojima et al. | |
| 8,994,030 B2 | 3/2015 | Kojima et al. | |
| 9,653,440 B2 | 5/2017 | Moosburger et al. | |
| 9,721,940 B2 | 8/2017 | Plossl et al. | |
| 9,893,235 B2 | 2/2018 | Kang et al. | |
| 2003/0057421 A1 | 3/2003 | Chen | |
| 2004/0022433 A1 | 2/2004 | Acharya et al. | |
| 2004/0222433 A1 | 11/2004 | Mazzochette et al. | |
| 2006/0006404 A1* | 1/2006 | Ibbetson | H01L 23/481 257/99 |
| 2006/0057751 A1 | 3/2006 | Shen | |
| 2006/0163596 A1 | 6/2006 | Kim et al. | |
| 2006/0243999 A1 | 11/2006 | Shen | |
| 2011/0272729 A1 | 11/2011 | Kim et al. | |
| 2012/0074441 A1 | 3/2012 | Seo et al. | |
| 2012/0098025 A1 | 4/2012 | Hoppel | |
| 2013/0134473 A1* | 5/2013 | Brunner | H01L 24/73 257/99 |
| 2013/0175573 A1* | 7/2013 | Mayer | H01L 33/44 257/103 |
| 2014/0014990 A1 | 1/2014 | Kim et al. | |
| 2014/0246648 A1 | 9/2014 | Im et al. | |
| 2014/0293554 A1 | 10/2014 | Shashkov et al. | |
| 2015/0349201 A1* | 12/2015 | Lee | H01L 33/22 257/79 |
| 2018/0151548 A1* | 5/2018 | Pfeuffer | H01L 33/642 |

FOREIGN PATENT DOCUMENTS

| | | |
|---|---|---|
| DE | 102009033686 A1 | 1/2011 |
| DE | 102010045783 A1 | 3/2012 |
| DE | 102013110853 A1 | 4/2015 |
| EP | 2355196 A2 | 8/2011 |
| EP | 2461382 A2 | 6/2012 |
| JP | H09283556 A | 10/1997 |
| JP | 2000286366 A | 10/2000 |
| JP | 2008505508 A | 2/2008 |
| JP | 2008098218 A | 4/2008 |
| JP | 2010021507 A | 1/2010 |
| JP | 2011166141 A | 8/2011 |
| JP | 2011187679 A | 9/2011 |
| JP | 2013106048 A | 5/2013 |
| JP | 2013232503 A | 11/2013 |
| KR | 101437930 B1 | 9/2014 |
| WO | 2014056911 A1 | 4/2014 |
| WO | 2014128574 A1 | 8/2014 |
| WO | 2015049079 A1 | 4/2015 |

* cited by examiner

COMPONENT HAVING A METAL CARRIER AND METHOD FOR PRODUCING COMPONENTS

This patent application is a national phase filing under section 371 of PCT/EP2016/066810, filed Jul. 14, 2016, which claims the priority of German patent application 10 2015 112 280.4, filed Jul. 28, 2015, each of which is incorporated herein by reference in its entirety.

TECHNICAL FIELD

A component having a metal carrier and a method for producing a plurality of components are provided.

BACKGROUND

An optoelectronic component comprising a carrier, which contains a molded body made of a plastic, has an insufficient mechanical stability at least in places. With regard to thermal resilience and cycle stability, in particular with regard to cyclic temperature changes, the molded body made of a plastic, for instance, made from a casting compound, poses a potential risk.

SUMMARY OF THE INVENTION

Embodiments provide a component having a high mechanical and thermal stability. Further embodiments provide a cost-effective method for producing one or a plurality of components.

According to at least one embodiment of a component, the component has a carrier and a semiconductor body arranged on the carrier. The carrier has a front side facing towards the semiconductor body and a rear side facing away from the semiconductor body. In particular, the carrier is produced directly on the semiconductor body, for example, on a semiconductor composite at wafer level. This means that the carrier is not produced, for instance, in a production step separate from the semiconductor body and is fixed to the semiconductor body, for example, by means of a connecting layer, but is produced directly on the semiconductor body, that is to say in the presence of the semiconductor body. For example, the carrier comprises a plurality of layers which are applied successively to the semiconductor body.

The semiconductor body has, for example, a first semiconductor layer of a first charge carrier type facing away from the front side of the carrier, a second semiconductor layer of a second charge carrier type facing towards the front side of the carrier, and an active layer arranged in vertical direction between the first and the second semiconductor layers. In particular, the active layer is a pn-junction zone, which is formed as a single layer or as a layer sequence of a plurality of layers. The active layer is preferably configured for emitting an electromagnetic radiation, for instance in the visible, ultraviolet or infrared spectral range, or for absorbing an electromagnetic radiation and converting the same into electrical signals or electrical energy. The semiconductor body can be applied layer-wise to a growth substrate by means of an epitaxy method. The growth substrate, however, can be removed from the semiconductor body in a subsequent method step so that the component is in particular free of a growth substrate.

A vertical direction is understood to mean a direction which is in particular perpendicular to a main extension area of the semiconductor body. In particular, the vertical direction is the growth direction of the semiconductor layers of the semiconductor body. A lateral direction is understood to mean a direction which runs in particular parallel to the main extension area of the semiconductor body. In particular, the vertical direction and the lateral direction are directed transversely, for instance perpendicular to one another.

According to at least one embodiment of the component, the component has a wiring structure, which is arranged at least in regions between the carrier and the semiconductor body in the vertical direction. The wiring structure is configured for electrically contacting the semiconductor body. On a surface of the wiring structure facing towards the carrier, the wiring structure can comprise a first connection area and a second connection area, which are assigned, for example, to different electrical polarities. In particular, the front side of the carrier adjoins the first and/or the second connecting area of the wiring structure.

According to at least one embodiment of the component, the carrier has a metallic carrier layer. In particular, the carrier layer forms a main integral part of the carrier, wherein the metallic carrier layer mechanically carries and stabilizes the carrier and the entire component. In this case, at least 50%, for example, at least 60% or at least 70% of the volume and/or of the weight of the carrier may be formed by the carrier layer. For electrically contacting the semiconductor body, the carrier can have a first through-contact, which extends in the vertical direction in particular throughout the carrier layer. In this case, the first through-contact can be completely surrounded in lateral directions by the carrier layer and electrically insulated from the carrier layer by one insulating layer. At the front side of the carrier, the first through-contact is in physical and thus in electrical contact, for example, with one of the connection areas. The metallic carrier layer can be electrically conductively connected to one of the connection areas or can be electrically insulated both from the first connection area and from the second connection area. The component can be formed in such a way that it can be electrically connected externally via the carrier.

According to at least one embodiment of the component, the carrier has a metal proportion of at least 60% vol-% and/or wt-%. This means that the carrier is predominantly made of metal. Such a carrier has a particularly high mechanical stability. In addition, a carrier which essentially consists of metal is particularly suitable for heat dissipation. In particular, the metal proportion of the carrier can be at least 70, at least 80 and preferably at least 90 or 95 vol-% and/or wt-%. The carrier or the component is in particular free of a molded body made of a mold compound, for example, of epoxy, resin or silicone.

In at least one embodiment of the component, the component comprises a carrier, a semiconductor body and a wiring structure arranged in the vertical direction between the carrier and the semiconductor body at least in places. The wiring structure is configured for electrically contacting the semiconductor body and has a first connection area and a second connection area. The connection areas of the wiring structure are assigned to different electrical polarities of the component and adjoin the carrier. The carrier has a metallic carrier layer and a first through-contact, wherein the first through-contact extends in the vertical direction throughout the carrier layer. Here, the first through-contact is electrically isolated from the carrier layer by means of an insulating layer and is in electrical contact with one of the connection areas at a front side of the carrier facing towards the wiring structure. The component is formed to be externally electrically connectable via the carrier. The carrier has a metal proportion of at least 60 vol-% and/or wt-%.

Such a component has a carrier which essentially consists of metal, as a result of which the component is formed in a particularly mechanically stable manner and heat dissipation is particularly promoted by the carrier.

According to at least one embodiment of the component, the carrier layer is formed in one piece and can be produced in a single method step. The carrier layer is formed in particular in a self-supporting manner. In this case, the carrier layer can have a vertical thickness which is for instance between 0.02 mm and 1 mm, inclusive, for example, between 0.02 mm and 0.5 mm, for example, between 0.02 mm and 0.2 mm. The carrier layer comprises a metal, such as nickel, copper, aluminum, or consists of one of these metals. The carrier layer can also comprise another metal. Preferably, the carrier layer comprises nickel or consists thereof, since nickel has a particularly high modulus of elasticity and is thus particularly hard in comparison to other metals. Furthermore, nickel can be applied onto the wiring structure in a patterned or unstructured form, for instance by means of a galvanic coating method, in a simplified manner.

As a result of the single-piece structure and high thickness of the carrier layer, the component receives a broad mechanical support and can withstand high bending loads.

According to at least one embodiment of the component, the carrier layer extends along the lateral direction over at least 80% of a lateral edge length of the semiconductor body. In particular, in a plan view of the semiconductor body, the carrier layer can cover at least 60%, at least 70% or at least 80% of a main surface of the semiconductor body facing the carrier. The carrier layer can be formed in such a way that the latter extends along two mutually adjoining edges or along all lateral edges of the semiconductor body over at least 70%, for instance at least 80%, preferably over at least 90% of the associated respective lateral edge lengths of the semiconductor body.

According to at least one embodiment of the component, the carrier layer has a vertical thickness. In particular, the first through-contact protrudes in the vertical direction beyond the carrier layer about a vertical height, wherein the vertical thickness of the carrier layer is at least three times, for instance at least five times or at least ten times as large as the vertical height. The carrier layer can have an opening through which the first through-contact extends. Here, the first through-contact can be formed in such a way that, in a plan view of the semiconductor body, the latter completely covers the opening or completely fills the opening of the carrier layer. For electrically isolating the first through-contact, the insulating layer can be arranged between the carrier layer and the first through-contact. The insulating layer is preferably an oxidized metal layer and/or a nano-ceramic layer. Such insulating layers have a particularly high thermal conductivity, namely up to 7 or 8 W/(m·K). A nano-ceramic layer is understood to mean an electrically insulating layer which contains, for example, crystalline powders containing metal or metal oxide and having grain sizes in the nanoscale, for instance in a range between 5 nm and 100 nm, for example, between 20 nm and 40 nm. For example, the insulating layer is a nano-ceramic layer containing aluminum oxide. Apart from this, the insulating layer can be formed from other inorganic dielectrics such as silicon nitride or silicon dioxide.

According to at least one embodiment of the component, the carrier has, in addition to the first through-contact, a second through-contact. The first and the second through-contacts are electrically connectable in particular at a rear side of the carrier on the opposite side of the front side. It is also possible for the first and second through-contacts to be completely covered each by a first contact layer or by a second contact layer. On the rear side of the carrier, the through-contacts are thus electrically connectable via the contact layers. The contact layers can be formed in such a way that they each form a solderable surface on the rear side of the carrier. The component can thus be formed as a surface-mountable component which is externally electrically connectable via a rear side of the component, which can be the rear side of the carrier. Heat generated during operation of the component can be directed into the carrier immediately via the wiring structure and effectively dissipated into the surrounding via the carrier.

In the vertical direction, the second contact extends for instance throughout the carrier layer and can be electrically isolated from the carrier layer by the insulating layer. At the front side of the carrier, the first through-contact and the second through-contact are in electrical contact for instance with the first connection area and the second connection area, respectively. The carrier and the connection structure can thus have a common interface, at which the through-contacts of the carrier are in electrical contact with the connection areas of the wiring structure. The first through-contact and/or the second through-contact can be formed from an electrically highly conductive and thermally highly conductive metal such as copper, aluminum, silver or other metal. The carrier can comprise a plurality of first, and a plurality of second through-contacts.

According to at least one embodiment of the component, the first through-contact and/or the second through-contact are formed from an electrically conductive and solderable material. Here, the carrier layer can have a plurality of openings, wherein in the respective openings the first or the second connection area of the wiring structure is exposed. The openings of the carrier layer can be filled with a solderable material, for instance in the form of solder balls. After a remelting step, the openings of the carrier layer can be completely filled with the solderable material. If the through-contacts are made of a solderable material, in particular in the form of solder balls protruding over the carrier layer, for the connection of the component to be produced for instance on a printed circuit board, it is sufficient only to provide a soldering flux, since upon its completion the component to be produced comprising the through-contacts already has a solder reservoir for a possible assembly. Thus, it is possible to dispense with applying additional solderable contact layers.

According to at least one embodiment of the component, the carrier has a further contact. The further contact is in particular in electrical contact with the carrier layer. This means that in this case the carrier layer is configured for electrically contacting the semiconductor body. The further contact can be electrically conductively connected to the second connection area for instance via the carrier layer. In particular at the front side of the carrier, the carrier layer can directly adjoin the second connection area and is thus in physical and electrical contact with the same.

According to at least one embodiment of the component, the carrier is formed exclusively from metal layers and the insulating layer or insulating layers. In this case, the metal layers can be the carrier layer, the through-contacts, the further contact, the contact layers and/or also adhesive or seed layers, wherein the seed layers are provided, for example, for applying the carrier layer, the through-contacts or the contact layers by means of a galvanic coating method. The insulating layer or the plurality of insulating layers is/are formed, for example, from a metal oxide or from metal oxides. The insulating layer or the plurality of insulating layers preferably consists/consist of metal oxide or metal oxides. The insulating layer or the plurality of insulating layers can be formed from a metal layer which is transformed into a metal oxide layer or from a plurality of metal layers which are transformed into metal oxide layers. For example, for forming the insulating layer an aluminum layer can be transformed in an aluminum oxide layer. In particular, the carrier can be formed exclusively from metal layers and a metal oxide layer or a plurality of metal oxide layers. This means that up to 100% of the carrier can consist of metal and metal oxide. Here, the carrier can comprise different metals and/or different metal oxides.

According to at least one embodiment of a method for producing one or a plurality of components, the carrier having the carrier layer, the insulating layer and the first through-contact is formed on the semiconductor body or on a semiconductor composite, which can be singulated into a plurality of semiconductor bodies. For example, the carrier layer is first applied onto the semiconductor body, in particular onto the wiring structure. The carrier layer can be applied in a structured manner or can be applied in a planar manner and subsequently structured such that the carrier layer has one or a plurality of openings. In particular, the first connection area or the second connection area of the wiring structure is exposed in the opening or in the openings. The insulating layer can subsequently be formed on the carrier layer, before the through-contact is formed in the opening or a plurality of through-contacts are formed in the respective openings of the carrier layer. The carrier is thus not produced separately from the semiconductor body and then fixed thereto, for example, by means of a connecting layer. Instead, the carrier is formed in the presence of the semiconductor body, that is to say directly on the semiconductor body. The formation of such a carrier can be carried out at wafer level, that is to say in a wafer composite, before the wafer composite is singulated, for example, into a plurality of components. The production costs of the components can thus be reduced in total by means of the formation of carriers at wafer level.

According to at least one embodiment of the method, the carrier layer is deposited onto the wiring structure by means of a galvanic method. In particular, the carrier layer is applied to the wiring structure in a structured manner with the aid of a structured lacquer layer or a photoresist layer. In this case, a seed layer can first be applied to the wiring structure. The seed layer is then covered by a lacquer layer, wherein in a subsequent method step the lacquer layer can be structured, for example, photostructured, so that the lacquer layer remains in particular only in regions which are provided for the openings of the carrier layer. The carrier layer can subsequently be applied galvanically to the seed layer, wherein, in order to expose the openings of the carrier layer, the lacquer layer is removed in one subsequent method step. It is also conceivable for the carrier layer to be first applied to the seed layer over a large area and removed or etched in places for forming the openings in a subsequent method step.

According to at least one embodiment of the method, the insulating layer is formed on the carrier layer by an electrochemical process. In an electrochemical process, a metal oxide layer is formed as an insulating layer. In this case, one metal layer can be transformed into one metal oxide layer. The metal oxide layer can also be applied directly onto a metal layer. In particular, the carrier layer and the insulating layer can have the same material. By way of example, the carrier layer comprises aluminum or consists thereof. If aluminum is deposited to form the carrier layer, aluminum can then be transformed into aluminum oxide by an electrochemical process. Furthermore, aluminum oxide can be deposited directly onto an aluminum layer. In this case, no additional phototechnique is required for forming the insulation layer made of aluminum oxide on an aluminum carrier layer, since aluminum oxide, such as Al2O3, usually can be deposited only on aluminum or transformed therefrom.

It is also conceivable for the carrier layer to be a nickel layer and the insulating layer to be a nickel oxide layer, wherein the nickel oxide layer may be formed on the nickel layer by means of an electrochemical process. Alternatively, for forming the insulating layer, further inorganic dielectric materials can be applied onto the carrier layer by means of a coating method such as chemical vapor deposition or physical vapor deposition.

According to at least one embodiment for producing a plurality of components, a wafer composite is provided. The wafer composite can have a semiconductor composite and a plurality of metallic carrier layers. A plurality of separating trenches are formed, as a result of which the semiconductor composite is subdivided into a plurality of semiconductor bodies, each of which is assigned to one of the carrier layers. The wafer composite is singulated along the separating trenches into a plurality of components in such a manner that each component comprises a semiconductor body and a carrier with the associated carrier layer.

The wafer composite can have a growth substrate, onto which the semiconductor composite is applied for instance layer-wise by means of an epitaxy method. Prior to the singulation of the wafer composite, the growth substrate can be removed from the semiconductor composite or from the semiconductor bodies, so that the finished components are preferably free of a growth substrate. The through-contact or the plurality of through-contacts is/are formed preferably prior to the singulation, so that immediately after the singulation, each of the components comprises a carrier having at least one through-contact.

According to at least one embodiment of the method for producing a plurality of components, prior to the singulation the carrier layers are formed in such a way that they are mechanically connected to one another by support bars. Each of the support bars can connect two adjacent carrier layers. In particular, the support bars are produced after the formation of the separating trenches, so that the support arms in each case laterally bridge one of the separating trenches. In particular, the support bars are severed during the singulation of the wafer composite. By means of the support bars the carrier layers are mechanically connected to one another, such that the wafer composite is further mechanically supported by one contiguous structure, namely by the contiguous carrier layers, even after the growth substrate has been removed. The support bars and the carrier layers can be formed from the same materials and/or in the same method step.

According to at least one embodiment of a method, a converter layer is applied to the semiconductor body of the component to be produced. In particular, the converter layer contains a converter material which is configured for converting electromagnetic radiation of a first wavelength into electromagnetic radiation of a second wavelength, wherein the second wavelength is in particular greater than the first wavelength. In particular, the active layer is configured for emitting electromagnetic radiation of a first wavelength. The converter layer can be formed on the semiconductor composite or on the semiconductor body prior to or after the singulation step.

The method described above is particularly suitable for the production of a component described here. Features described in connection with the component can therefore also be used for the method and vice versa.

BRIEF DESCRIPTION OF THE DRAWINGS

Further advantages, preferred embodiments and further developments of the method as well as of the component will become apparent from the exemplary embodiments explained below in conjunction with FIGS. 1A to 11.

Figure 1A:
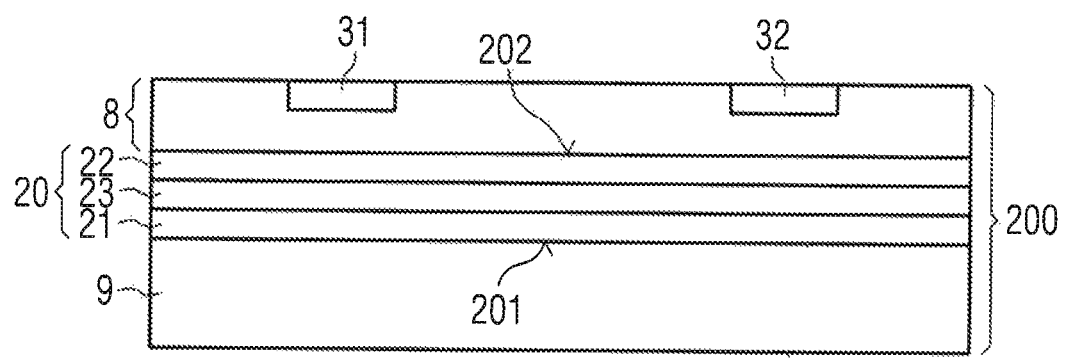
FIGS. 1A to 1D, FIGS. 2A to 2B, FIGS. 3A to 3B, FIGS. 4A to 4C, FIGS. 5A to 5C and FIG. 6 show different method stages of an exemplary embodiment of a method for producing one or a plurality of components in schematic sectional views.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

A composite 200 is shown in FIG. 1A. In particular, the composite 200 is a wafer composite. The composite 200 has a semiconductor composite 20. The semiconductor composite 20 is arranged on a substrate 9. In particular, the substrate 9 is a growth substrate, for example, a sapphire substrate, wherein the semiconductor composite 20 is preferably grown layerwise on the substrate 9 by means of an epitaxy method. The growth direction is in particular perpendicular to a main plane of extension of the substrate 9. In particular, the growth direction is perpendicular to a first main surface 201 and/or a second main surface 202 of the semiconductor composite 20. In FIG. 1A, the first main surface 201 faces towards the substrate 9 and the second main surface 202 faces away from the substrate 9.

The semiconductor composite 20 can be formed from a III/V compound semiconductor material. An III/V compound semiconductor material has an element from the third main group, such as B, Al, Ga, In, and an element from the fifth main group, such as N, P, As. In particular, the term "III/V compound semiconductor material" comprises the group of binary, ternary or quaternary compounds which comprise at least one element from the third main group and at least one element from the fifth main group, for example, nitride and phosphide compound semiconductors. Such a binary, ternary or quaternary compound can additionally contain, for example, one or more dopants and additional constituents. The semiconductor composite 20 can also be formed from a II/VI compound semiconductor material.

The semiconductor composite 20 has a first semiconductor layer 21, a second semiconductor layer 22 and an active layer 23 arranged in vertical direction between the semiconductor layers. The first main surface 201 can be formed by a surface of the first semiconductor layer 21 and the second main surface 202 can be formed by a surface of the second semiconductor layer 22. For example, the first semiconductor layer is formed in an n-conducting manner and the second semiconductor layer 22 is formed in a p-conducting manner, or vice versa.

A wiring structure 8 is formed on the side of the second main surface 202 of the semiconductor composite 20. The wiring structure 8 is configured in particular for electrically contacting the semiconductor composite 20, wherein the wiring structure 8 can be electrically conductively connected for instance directly or indirectly to different semiconductor layers of the semiconductor composite 20. The wiring structure can have sub-structures which are electrically separated from one another and each are electrically conductively connected to one of the semiconductor layers 21 and 22 (not explicitly shown here).

In FIG. 1A, the wiring structure 8 has a first connection area 31 and a second connection area 32. In particular, in a vertical direction the wiring structure 8 terminates flush with the connection areas 31 and 32. This means that the connection areas 31 and 32 delimit the wiring structure 8 regionally in the vertical direction. For example, the first connection area 31 and the second connection area 32 are provided for electrically contacting the first semiconductor layer 21 and the second semiconductor layer 22, respectively, or vice versa. The wiring structure 8 can have a plurality of such first connection areas 31 and/or a plurality of such second connection areas 32. The connection areas 31 and 32 can be closed with a noble metal, for instance with gold.

Figure 1B:

FIG. 1B shows the composite 200 illustrated in FIG. 1A in a plan view. The first connection area 31 and the second connection area 32 are exposed on a surface of the wiring structure 8 remote from the semiconductor composite 200 and thus are directly electrically connectable. The first connection area 31 and the second connection area 32 are in particular assigned to different electrical polarities of a component to be produced. For example, the first connection area 31 is assigned to the cathode and the second connection area 32 is assigned to the anode of the component, or vice versa. In FIG. 1B, the connection areas 31 and 32 are illustrated in a circular shape. Deviating therefrom, the connection areas 31 and 32 can each have any arbitrary shape, for example, square, elliptical, strip-shaped, polygonal or other shapes.

Figure 1C:
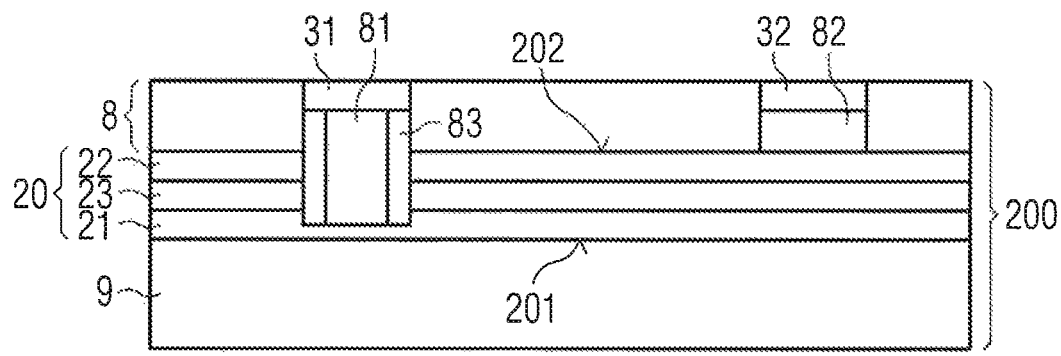

The exemplary embodiment illustrated in FIG. 1C corresponds substantially to the exemplary embodiment illustrated in FIG. 1A. In contrast to this, the wiring structure 8 is schematically illustrated in a somewhat more detailed manner. The first connection area 31 can be in electrical contact with a through-via 81 of the wiring structure 8. In particular, the first connection area 31 can be a surface of the through-via 81. It is also possible for the first connection area 31 to be a surface of a further layer which is electrically conductively connected to the through-via 81. In the vertical direction, the through-via 81 extends at least from the second main surface 202 throughout the second semiconductor layer 22 and the active layer 23 into the first semiconductor layer 21. In the lateral direction, the through-via 81 is thus completely enclosed by the semiconductor composite 20. For electrically insulating the through-via 81 from the second semiconductor layer 22 and from the active layer 23, the through-via is laterally enclosed by a passivation layer 83. The first semiconductor layer 21 can thus be electrically connected to the first connection area 31 via the through-via 81.

The wiring structure 8 has a connection layer 82. The connection layer 82 is provided for electrically contacting the second semiconductor layer 22. In this case, the connection layer 82 can be adjacent to the semiconductor layer 22. The second connection area 32 can be a surface of the connection layer 82 or surface of a further layer, which, for example, is adjacent to the connection layer 82 or for instance is electrically conductively connected adjacent to the connection layer 82.

Deviating from FIG. 1C, the wiring structure 8 can have a plurality of such through-vias 81 and/or a plurality of such connection layers 82. It is also possible for the wiring structure to have one radiation-reflective layer, for example, a mirror layer, which is arranged on the second main surface 202 of the semiconductor composite 20. The reflective layer is particularly configured for reflecting an electromagnetic radiation, which, during operation of the component to be produced, is emitted in the direction of the first main surface 201 of the semiconductor composite 20. Here, the reflective layer of the wiring structure 8 can be formed to be electrically conductive. In particular, for lateral current spreading the reflective layer can be electrically conductively connected to a plurality of connection layers 82 or to a plurality of through-vias 81. The wiring structure 8 can have a plurality of reflective layers, which in each case are assigned to, for example, one of the components to be produced. It is also possible for the component, which is to be produced, to be formed as a multi-junction chip. Such a component can have a segmented semiconductor body and, for example, more than two connection areas for electrically contacting different segments of the semiconductor body.

Figure 1D:
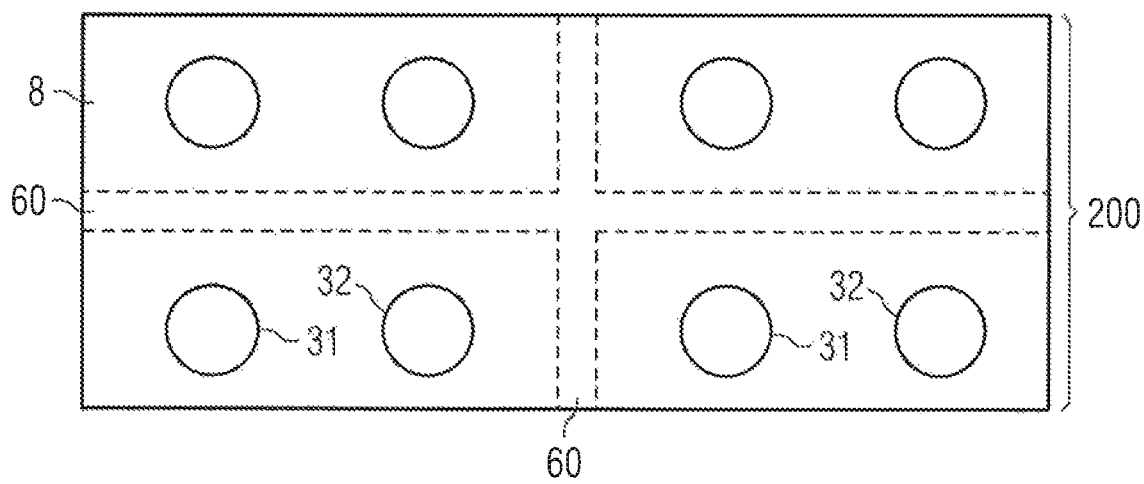

The exemplary embodiment illustrated in FIG. 1D substantially corresponds to one of the exemplary embodiments illustrated in FIGS. 1A to 1C. In contrast to this, the composite shown here has a plurality of first connection areas 31 and a plurality of second connection areas 32. The composite 200 has a plurality of separating trenches 60, by means of which the composite 200 is divided into a plurality of partial regions, wherein each partial region of the composite 200 has a wiring structure 8 comprising at least one first connection area 31 and a second connection area 32. The separating trenches 60 extend in the vertical direction at least partially into the semiconductor composite 20 or throughout the semiconductor composite 20. As a result of which the semiconductor composite 20 can be divided into a plurality of semiconductor bodies 2. The separating trenches are preferably formed prior to the formation of the wiring structure 8. It is also conceivable, however, that the separating trenches 60 are formed only after the formation of the wiring structure 8. In one subsequent method step, the composite 200 can be singulated along the separating trenches 60 into a plurality of components 100.

Figure 2A:
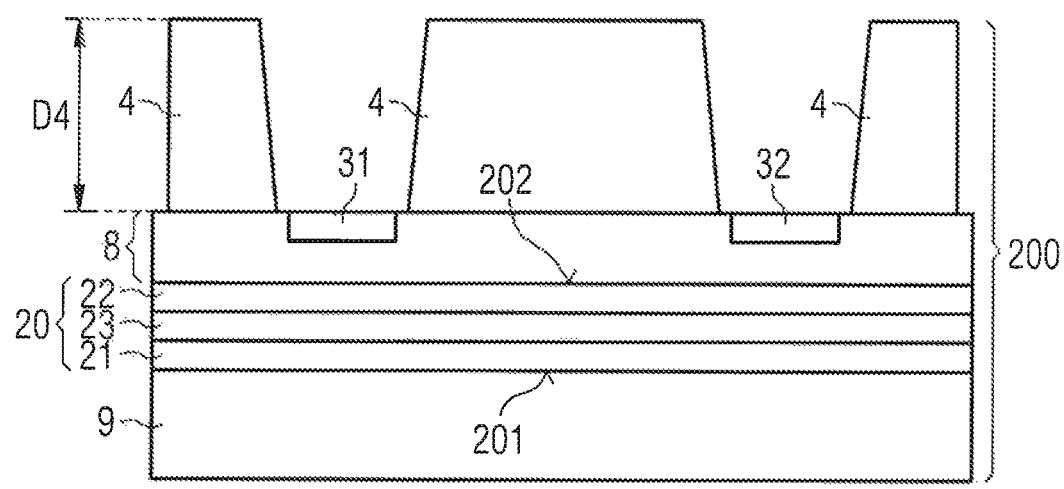

In FIG. 2A, a carrier layer 4 on the side of the wiring structure 8 is formed on the semiconductor composite 20. The carrier layer 4 can comprise a metal or a plurality of metals, for example, in the form of a metal alloy. The carrier layer 4 illustrated in FIG. 2A is, for example, a partial region of the composite 200, wherein the partial region is assigned to one of the components to be produced. In particular, the carrier layer 4 is formed in a contiguous manner, for example, in one piece. The carrier layer illustrated in FIG. 2A is structured and has two openings. A connection area 31 or 32 of the wiring layer 8 is exposed in each opening. In particular, the connection areas 31 and 32 are electrically isolated from the carrier layer 4.

The carrier layer 4 can be formed as an electroplating layer in a structured lacquer layer, such as a photoresist layer. In FIG. 2A, the structured lacquer layer is not shown. Such a structured lacquer layer can, however, cover regions of the openings of the carrier layer 4 and side surfaces of the carrier layer 4. It is also possible for the carrier layer 4 to be first applied to the wiring structure 8 over a large area and, in a subsequent method step, to be removed or etched in places for forming the openings. The carrier layer 4 is preferably applied to the wiring structure 8 by means of a galvanic coating method. Metals such as nickel, copper, aluminum, silver, gold or other electro-depositable metals are particularly suitable as materials for the carrier layer 4. The carrier layer 4 has a vertical thickness D4, which is for instance between 0.02 mm and 1 mm, in particular between 0.02 mm and 0.5 mm, for example, between 0.02 mm and 0.2 mm.

Deviating from FIG. 2A, it is possible for a plurality of carrier layers 4 to be formed on the semiconductor composite 20. For example, the partial regions of the composite 200, as shown in FIG. 1D, can each have an associated carrier layer 4 comprising at least one opening.

Figure 2B:
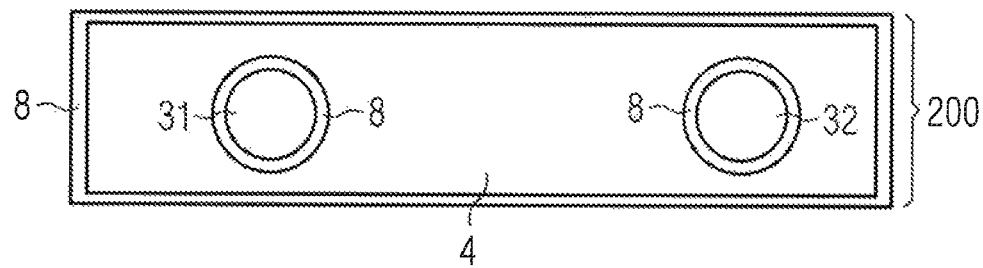

In a plan view, the exemplary embodiment illustrated in FIG. 2B substantially corresponds to the exemplary embodiment illustrated in FIG. 2A. In particular, a section or a partial region of the composite 200 is illustrated in FIG. 2B, wherein the section or the partial region of the composite 200 corresponds to a component 100 to be produced. The carrier layer 4 is formed in one piece. In a plan view, the wiring structure 8 has an edge region which is frame-shaped and laterally encloses the carrier layer 4. The edge region of the wiring structure 8 is thus not covered by the carrier layer 4. In particular, the area of the edge region is at most 20%, in particular at most 10%, preferably at most 5%, of a total area of the associated wiring structure 8. In FIG. 2B, the wiring structure 8 comprises a region in the respective opening of the carrier layer 4, which is not covered by the carrier layer 4 and encloses the first connection area 31 or the second connection area 32. This region of the wiring structure 8 within the opening of the carrier layer can have an electrically insulating material or be covered by an insulating material.

Figure 3A:
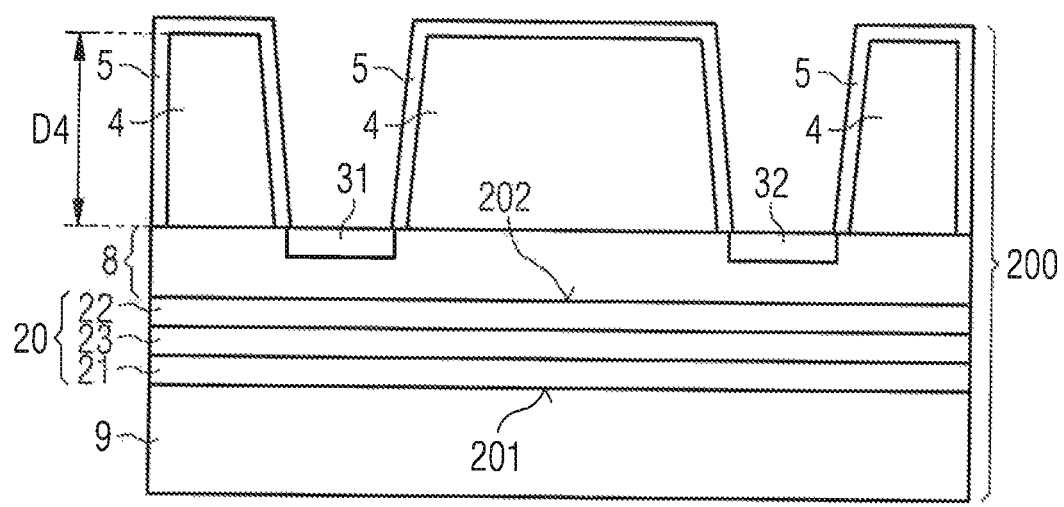

In FIG. 3A, an insulating layer 5 is formed on the carrier layer 4. In particular, the insulating layer 5 is produced by an electrochemical process. Preferably, aluminum as the material of the carrier layer 4 is galvanically deposited onto the wiring structure 8. Aluminum can be transformed into aluminum oxide by an electrochemical process. Aluminum oxide can also be deposited directly onto an aluminum layer formed as a carrier layer 4. Since the aluminum oxide is deposited in a reliable manner only on aluminum, in this case, no additional phototechnique is required. It is also possible for the carrier layer to comprise nickel. In this case, nickel can be applied to the wiring structure 8 by means of a galvanic process. In a subsequent method step, nickel can be transformed in regions into nickel oxide. It is also conceivable for nickel oxide to be deposited directly on the carrier layer 4, comprising for instance nickel, by an electrochemical process. It is also conceivable for the metal oxide layer made of magnesium, titanium, zirconium, tantalum or beryllium to be formed by an electrochemical process. Alternatively, inorganic dielectrics can be applied to the carrier layer 4 for instance by chemical or physical vapor deposition.

The use of electrochemically deposited metal oxides, for example, of aluminum oxide or nickel oxide, results in a mechanically particularly stable connection between a metal layer and a metal oxide layer, for example, between an aluminum layer and an aluminum oxide layer, as a result of which a particularly high thermal conductivity is achieved within the entire carrier on the one hand and, on the other hand, compared to conventional metal-dielectrics connections, a high adhesive strength is achieved. In addition, the deposition process can ensure that the steps of the carrier layer 4, which are formed on account of the comparatively large vertical thickness D4 of the carrier layer 4, can be coated in an isolation-proof manner. A metal oxide layer, which is produced electrochemically, usually has a higher porosity degree than a corresponding metal layer. Based on the degree of porosity of the metal oxide layer, it can be determined whether the metal oxide layer has been produced by means of an electrochemical process or not. For forming the insulating layer 5, it is also possible for the carrier layer 4 to be ceramic-coated. In the case of ceramic coating, a surface of the carrier layer 4 can likewise be oxidized partially. Both a ceramic coating layer and an aluminum oxide layer have a particularly high thermal conductivity. In particular, the thermal conductivity of a metal oxide layer may be for instance between 4 and 8 W/(K·m), inclusive. A ceramic coating layer can likewise have a thermal conductivity between 4 and 8 W/(K·m), inclusive. For example, the insulating layer 5 comprising aluminum oxide or an aluminum nanoceramic may have a thermal conductivity of greater than 7 W/(K·m). Preferably, the insulating layer 5 has a thermal conductivity of at least 4, at least 6 or at least 7 W/(K·m).

Figure 3B:
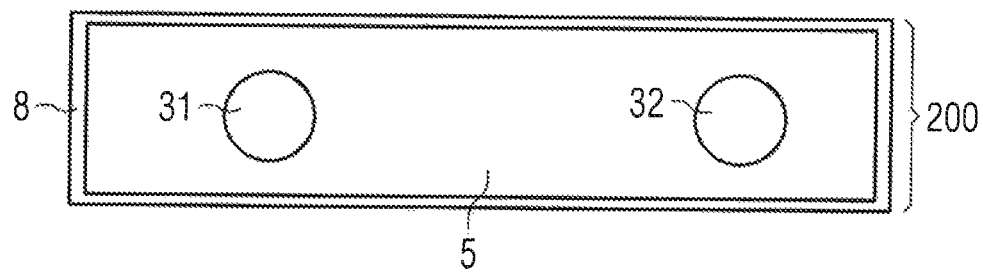

FIG. 3B shows the exemplary embodiment illustrated in FIG. 3A in a plan view. In a plan view, the insulating layer 5 completely covers the carrier layer 4. The insulating layer 5 is formed in particular contiguously and has at least one opening, in which the first connecting area 31 or the second connecting area 32 is exposed. In comparison to the metal layer 4, the insulating layer 5 has a smaller thickness, so that the insulating layer 5 coats the carrier layer 4 and, in particular, imitates a contour of the carrier layer 4.

Figure 4A:
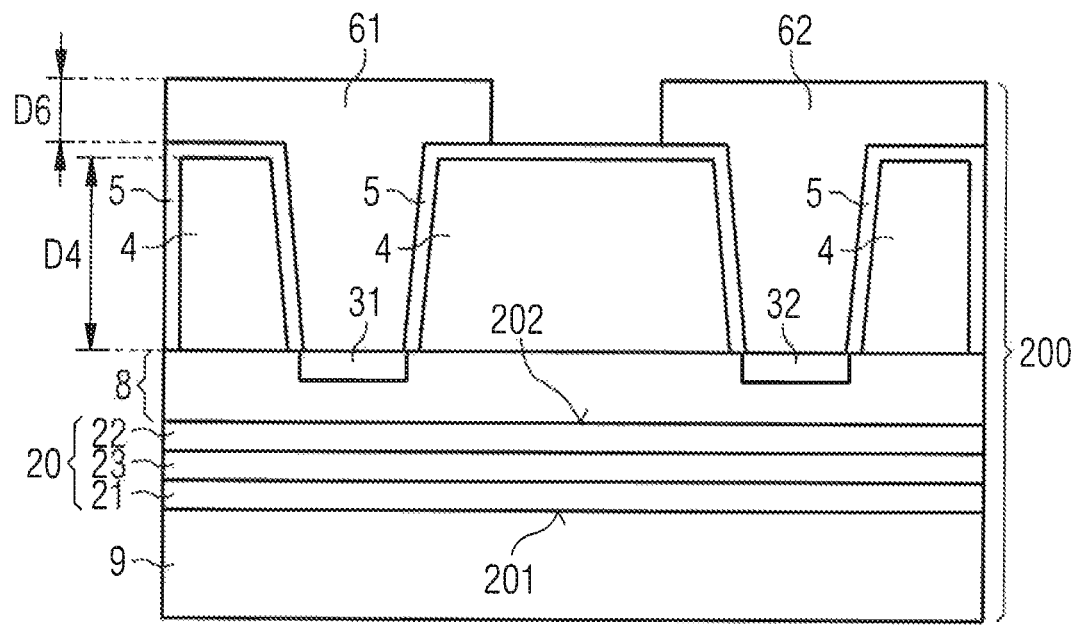

In FIG. 4A, a first through-contact 61 and a second through-contact 62 are formed. The through-contacts 61 and 62 fill out the respective openings of the carrier layer 4. The first through-contact 61 and/or the second through-contact 62 extend/extends in the vertical direction throughout the carrier layer 4 and are/is electrically conductively connected to the first connection area 31 or the second connection area 32 in the region of the openings of the carrier layer 4. The through-contacts 61 and 62 can be applied to the carrier layer 4 by means of a coating method, for instance by means of a galvanic or electroless method. The through-contacts 61 and 62 can also be formed by means of physical or chemical vapor deposition. The carrier layer 4 and the through-contacts 61 and 62 can comprise the same material, for example, an identical metal such as aluminum, copper, nickel, gold or silver. If the carrier layer 4 and the through-contacts 61 and 62 comprise the same material, a carrier 1 formed therefrom can have a particularly high thermal resilience due to thermal expansion reasons.

In the vertical direction, the first through-contact 61 and the second through-contact 62 project beyond the carrier layer 4 by a vertical height D6. In particular, the carrier layer 4 and the through-contacts 61 and 62 are formed in such a way that the vertical thickness D4 of the carrier layer 4 is at least three times, preferably at least five times or at least ten times as large as the vertical height D6. The vertical height D6 is for instance between 0.001 mm and 0.5 mm inclusive, in particular between 0.001 mm and 0.3 mm, for example, between 0.001 mm and 0.15 mm.

In FIG. 4A, both the through-contacts 61 and 62 and the connection areas 31 and 32 are electrically isolated from the carrier layer 4 by the insulating layer 5. In such a configuration, the carrier layer 4 does not contribute to the electrical contacting of the semiconductor composite 20.

Figure 4B:
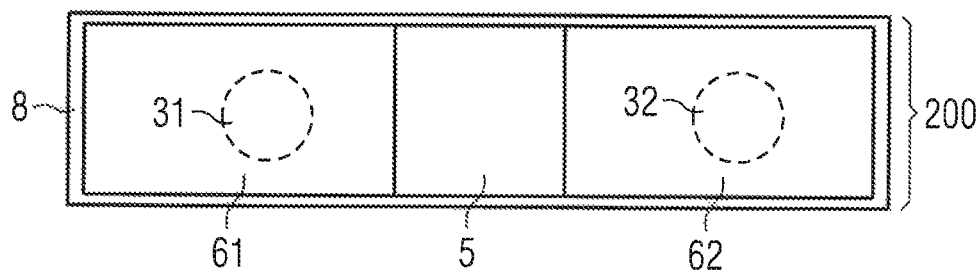
Figure 4C:
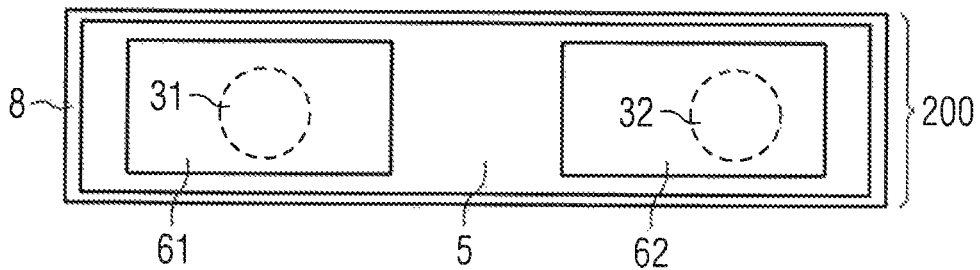

FIGS. 4B and 4C show different variants of configuration of the through-contacts 61 and 62 in a plan view. The through-contacts 61 and 62 completely cover the respective openings of the carrier layer 4. The through-contacts 61 and 62 can be formed in such a way that, in a plan view, they cover for instance at least 30%, at least 50%, at least 60% or at least 80% of one surface of the associated wiring structure 8 in total. The through-contacts 61 and 62, as shown in FIG. 4B, can cover the insulating layer 5 completely along one lateral direction. The through-contacts 61 and 62 can also be configured in such a way that they have a lateral width which is smaller than a lateral width of the insulating layer 5. In a plan view, the through-contacts 61 and 62 have overlaps with the insulating layer 5 both inside and outside the openings of the carrier layer 4.

In FIG. 4A, the openings of the carrier layer 4 each have a cross section which increases with increasing distance from the wiring structure 8. Such a configuration simplifies the formation of the through-contacts and the application of the insulating layer to the carrier layer 4. In contrast to this, it is also possible for the cross-section to decrease with increasing distance from the wiring structure 8 or to remain constant.

Figure 5A:
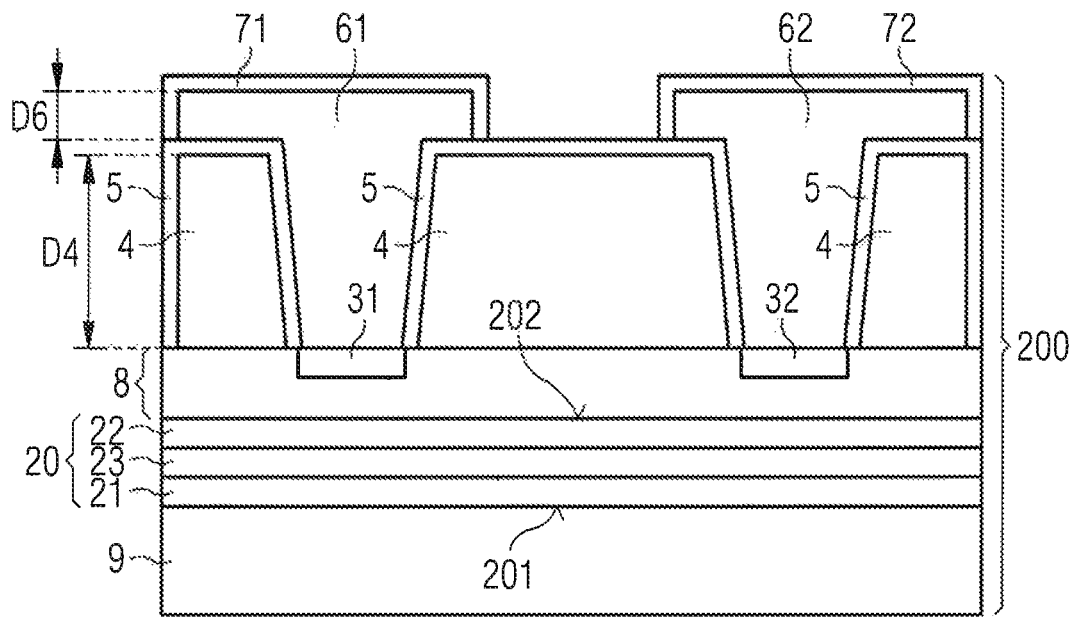

In FIG. 5A, the contact layers 71 and 72 are formed. The contact layers can be applied to the through-contacts 61 and 62 by a galvanic or electroless deposition process. For example, the contact layers 71 and 72 comprise a metal such as nickel, palladium or gold. In particular, the contact layers 71 and 72 each have a surface which faces away from the through-contacts and is formed to be solderable and electrically connectable. In particular, the component to be produced has a mounting surface which comprises the solderable and electrically contactable surfaces of the contact layers 71 and 72. The contact layers can be ENEPIG-layers (Electroless Nickel Electroless Palladium Immersion Gold). In particular, the component to be produced is configured to be surface-mountable.

Figure 5B:
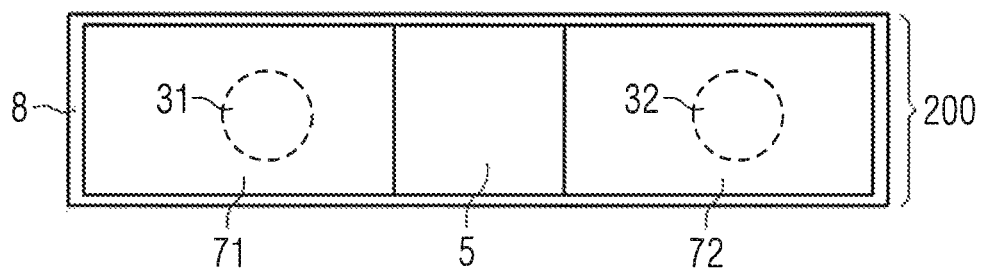
Figure 5C:
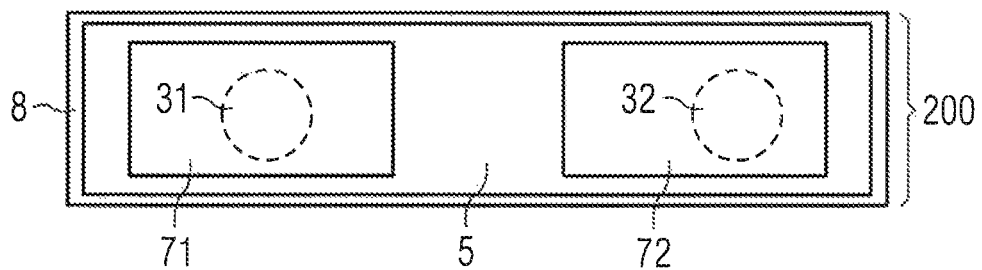

The exemplary embodiments shown in FIGS. 5B and 5C substantially correspond to the exemplary embodiments shown in FIGS. 4B and 4C. In contrast to these, the contact layers 71 and 72 are shown here. In a plan view, a first contact layer 71 can completely cover the first through-contact 61. In a plan view, a second contact layer 72 can completely cover the second through-contact 62.

Figure 6:
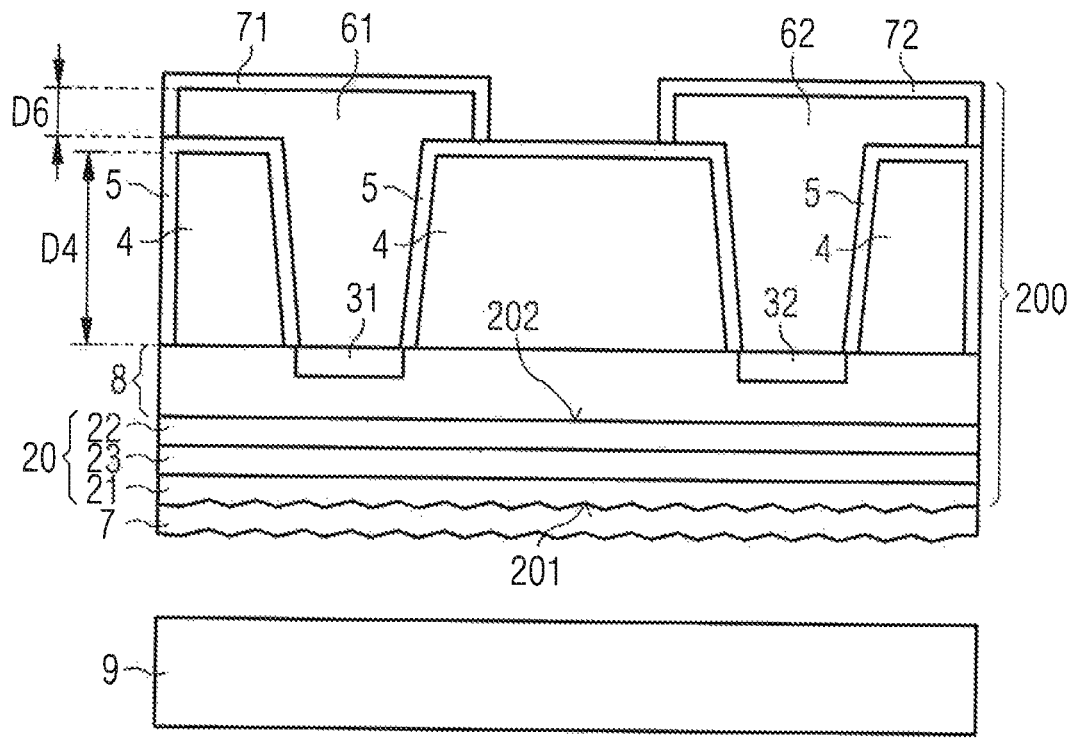

FIG. 6 shows the growth substrate 9, which is removed from the semiconductor composite 20 or from the semiconductor bodies 2, for instance by a mechanical method, an etching method or by a laser liftoff method. The separation of the growth substrate 9 can be carried out prior to the singulation or after the singulation of the composite 200 into a plurality of components 100.

For increasing the coupling-in or coupling-out efficiency, a surface exposed in the course of the removal of the growth substrate, in particular the first main surface 201 of the semiconductor composite 20 or of the semiconductor body 2, can be structured. Here, the structured surface may form a radiation passage area of the component 100. A converter layer 7 can be applied to the radiation passage area of the component. In this case, the converter layer 7 can imitate a contour of the structured radiation passage area and thus can also be structured. In contrast to FIG. 6, the converter layer 7 can be unstructured.

After the growth substrate 9 has been removed, the remaining composite 200 is mechanically supported, for example, mainly by the carrier layer 4. After the removal of the growth substrate 9, the composite 200 can be singulated into a plurality of components 100 in such a way that the singulated components 100 each have a carrier 1 and a semiconductor body 2 arranged on the carrier 1, wherein the semiconductor body 2 contains one portion of the semiconductor composite 20 and the carrier 1 contains one carrier layer 4 having at least one through-contact 61. The composite 200 can be singulated along the separating trenches 60, as shown, for example, in FIG. 1D. In particular, the separating trenches 60 are free of the carrier layer 4. It is also possible for the separating trenches 60 to be covered at least in places by an electrically isolating layer, wherein the electrically isolating layer can be part of the wiring structure 8 or part of the insulating layer 5, wherein in the region of the separating trenches 60, the electrically isolating layer covers, for example, side surfaces of the semiconductor body 2 partially or completely.

Figure 7:
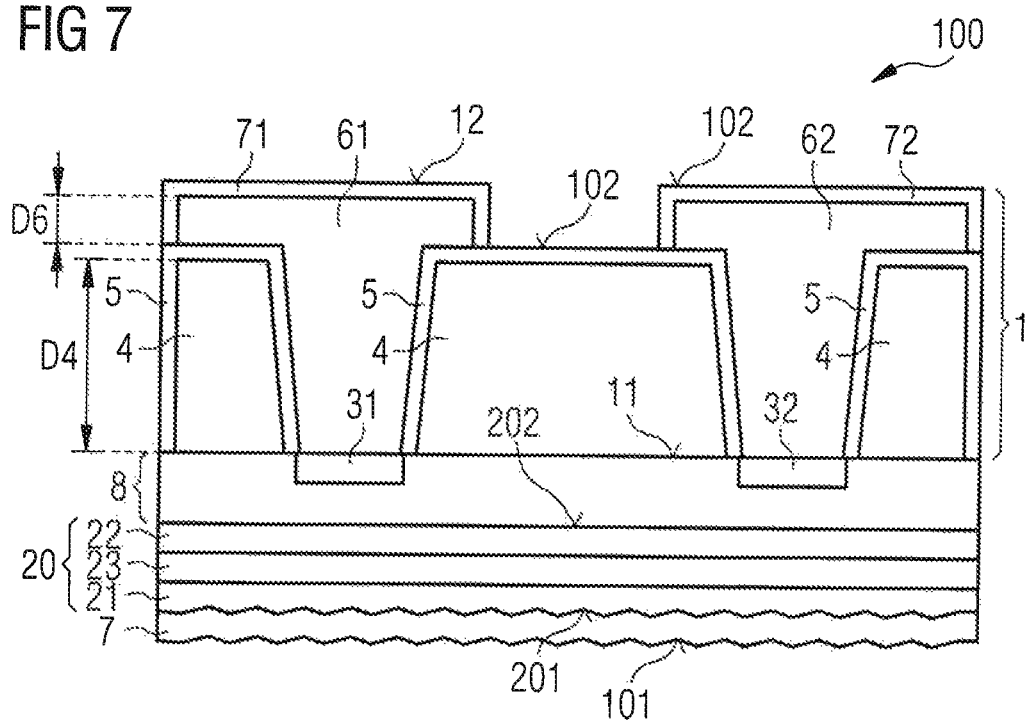
FIG. 7 shows an exemplary embodiment of a component in a schematic sectional view.

The exemplary embodiment illustrated in FIG. 7 for a component 100 substantially corresponds to a component which is produced according to the method described in FIGS. 1A to 6.

The component 100 has a radiation passage area 101, which is formed for instance by a surface of the converter layer 7. The component 100 comprises a rear side 102 facing away from the radiation passage surface 101. In particular, the rear side 102 of the component 100 is formed by a rear side 12 of the carrier 1. The carrier 1 has a front side 11 facing away from the rear side 12. In particular, the front side 11 of the carrier is an interface between the carrier 1 and the wiring structure 8 of the component 100. In other words, the carrier 1 and the wiring structure 8 directly adjoin one another at the front side 11. In particular, the first through-contact 61 and the second through-contact 62 directly adjoin the first connection area 31 and the second connection area 32 of the wiring structure 8, respectively, at the front side 11.

The rear side 12 is formed in places by a surface of the insulating layer 5 and in places by surfaces of the contact layers 71 and 72. The component 100 is formed to be mountable, for instance solderable, and electrically connectable via the rear side 12 of the carrier 1 or via the rear side 102 of the component 100.

In particular, the carrier 1 has a metal proportion of at least 60, at least 80 or at least 90% by volume and/or by weight. If the insulating layer 5 is a metal oxide layer, all layers of the carrier 1 can contain metal. In particular, the metal proportion of the carrier 1 can be between 90 and 98% by volume and/or by weight. In particular, the carrier 1 or the component 100 is free from a mold body made of a potting compound, for instance made of epoxy, resin or silicone. Thus, heat spreading along the lateral direction between the first through-contact and the second through-contact can be improved significantly.

Figure 8A:
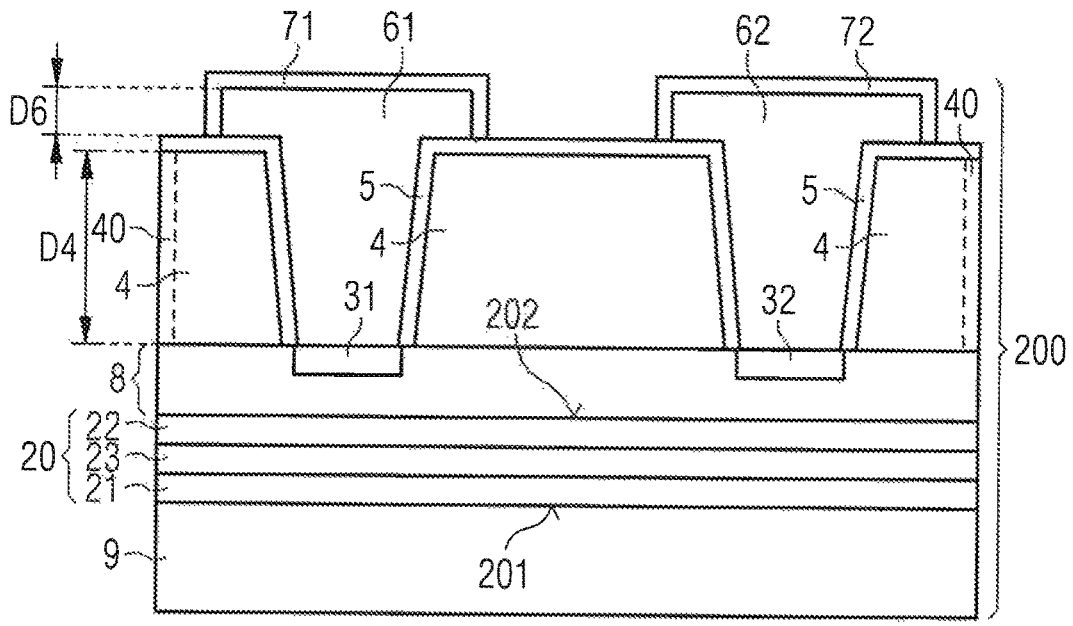
FIGS. 8A to 8C and FIGS. 9A to 9B show different method stages of further exemplary embodiments of a method for the production of one or a plurality of components in schematic sectional views.
Figure 8B:
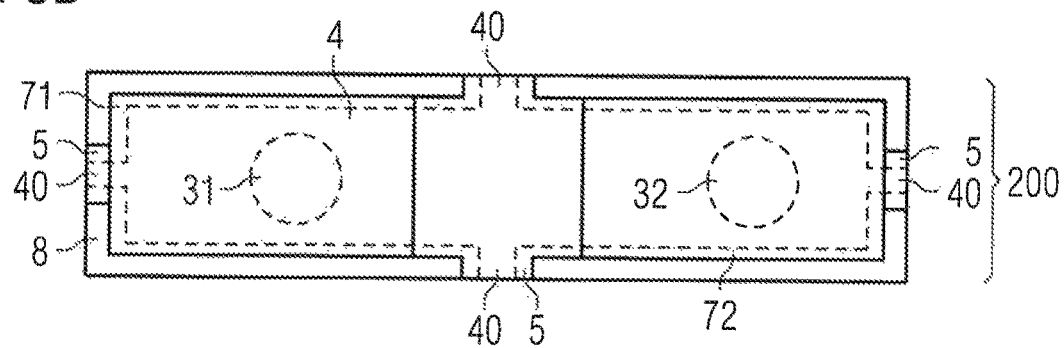
Figure 8C:
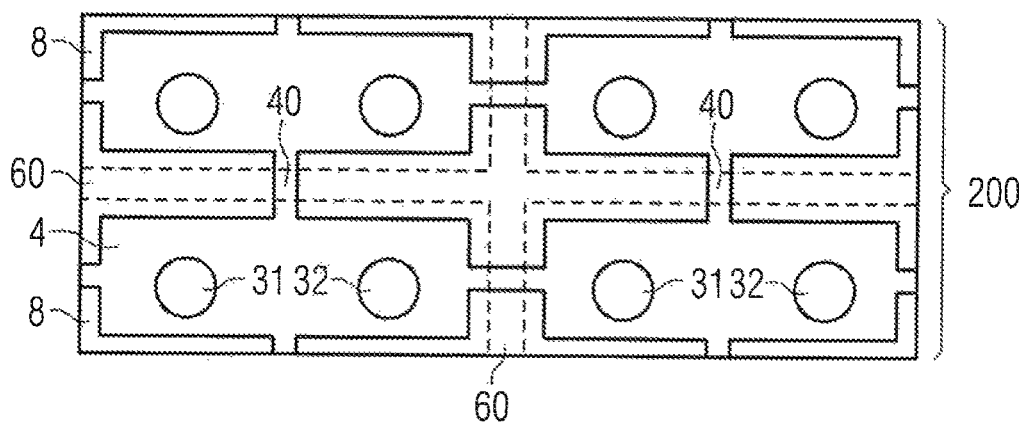

The exemplary embodiment illustrated in FIG. 8A substantially corresponds to the exemplary embodiment illustrated in FIG. 5A for a method for producing one or a plurality of components. In contrast to this, the composite has a plurality of support bars 40. Such support bars 40 are shown in particular in FIGS. 8B and 8C in a plan view. The carrier layers 4, which are assigned, for example, to different components 100 to be produced, are mechanically connected to one another by means of the support bars 40. In particular, the carrier layers 4 together with the support bars 40 form a contiguous structure. Such a contiguous structure can mechanically stabilize the composite 200, for instance after the growth substrate 9 has been removed.

The support bars 40 can be of the same material as the carrier layers 4. In particular, the support bars 40 and the carrier layers 4 can be produced during a common method step. In lateral directions, the support bars 40 project for instance over a side surface or beyond side edges of the carrier layers 4 and can in each case interconnect for instance two adjacent carrier layers 4. In a plan view, a support bar 40 can laterally bridge a separating trench 60 arranged between two adjacent carrier layers. Here, the support bars 40 can have a lateral width which is at least five times, for example, at least ten times, at least 15 times or preferably at least 20 times smaller than an associated lateral width of the carrier layer 4. During the singulation of the composite 200, the support bars are severed, for example, sawn through, in particular in the region of the separating trenches 60. In a plan view, the support bars 40 are preferably completely covered by the insulating layer 5. A complete covering of the support bars 40 by the insulating layer 5 can result in a reduction of possible metal contamination, for example, on the radiation passage area 101 of the component 100 to be produced.

Figure 9A:
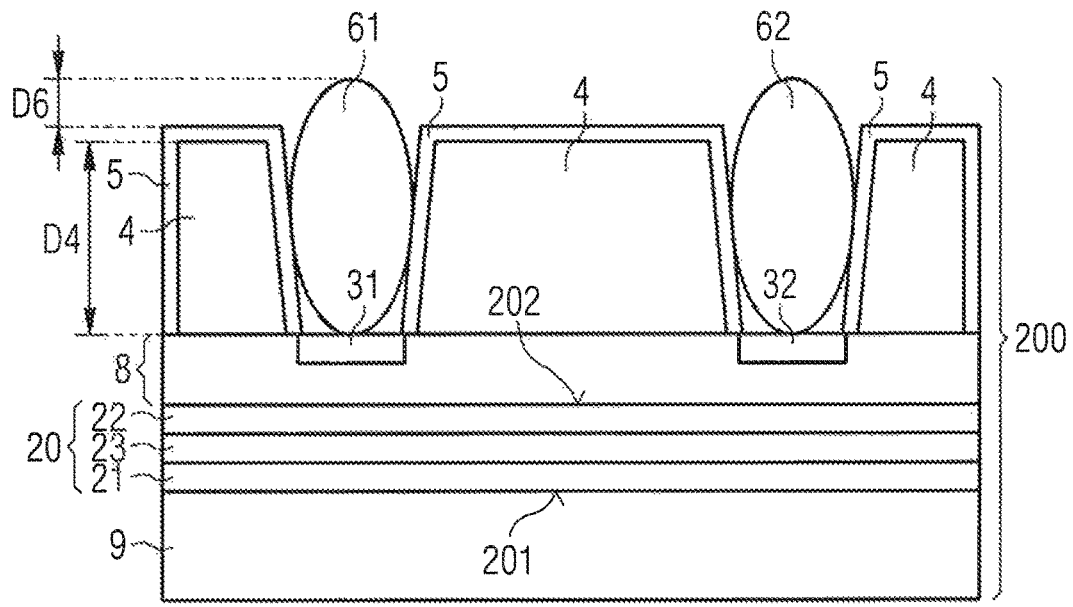

The exemplary embodiment illustrated in FIG. 9A substantially corresponds to the exemplary embodiment illustrated in FIG. 5A. In contrast thereto, the openings of the carrier layer 4 are filled for instance with a solderable material for forming the through-contacts 61 and 62. In particular, the solderable material, for instance in the form of solder balls, can be applied to the openings of the carrier layer 4. The solder balls can be prefabricated and placed in the corresponding openings of the carrier layer 4. The carrier layer 4 can have more than two openings, for example, three or four or more than four openings. Due to the three-point support it is preferred that each carrier layer 4 has at least three openings which are filled with a solderable material.

Figure 9B:
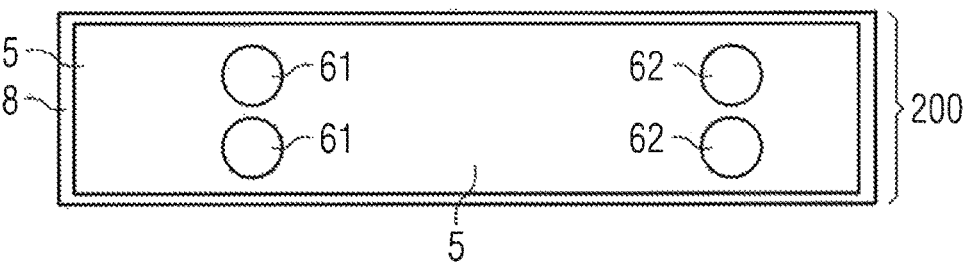

FIG. 9B shows the exemplary embodiment illustrated in FIG. 9A in a plan view. The carrier layer 4 has two openings, in which one connecting area 31 is exposed in each case, wherein the openings are filled with a solderable material for forming the first through-contacts 61. Furthermore, the carrier layer 4 has two further openings which are likewise filled with a solderable and electrically conductive material for forming the second through-contacts 62.

Figure 9C:
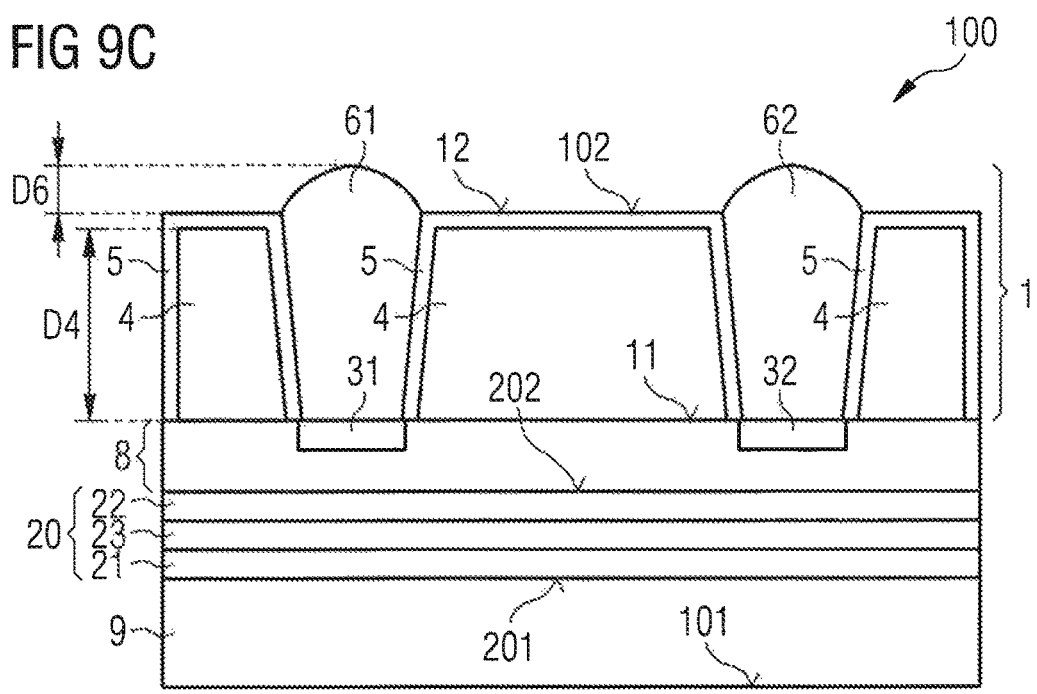
FIG. 9C, FIG. 10 and FIG. 11 show further exemplary embodiments of a component in schematic sectional views.

FIG. 9C shows a further exemplary embodiment of a component which is produced for instance according to an exemplary embodiment for a method illustrated in FIG. 9A. This exemplary embodiment substantially corresponds to the exemplary embodiment illustrated in FIG. 7. In contrast thereto, the component 100 is free from the contact layers 71 and 72. The through-contacts 61 and 62 are formed from an electrically conductive and solderable material. As illustrated in FIG. 9A, the through-contacts 61 and 62 can be formed after a step of remelting the solder balls. After the step of remelting, the through-contacts 61 and 62 can completely fill out the corresponding openings of the carrier layer 4. In a plan view, the through-contacts 61 and 62 have overlaps with the insulating layer 5 only within the openings of the carrier layer 4. However, it is also conceivable for the through-contacts 61 and 62 to have overlaps with the insulating layer 5 also outside the openings of the carrier layer 4. The component shown in FIG. 9C has a substrate which is in particular radiation-transmissive, in particular a growth substrate, for instance a sapphire substrate.

Deviating from FIG. 9C, it is possible for the component 100 to have a structured radiation passage area 101 and/or a converter layer 7 arranged on the radiation passage area 101. It is also possible for the substrate 9 to be completely removed from the component 100, so that the component 100 is free of a growth substrate.

Figure 10:
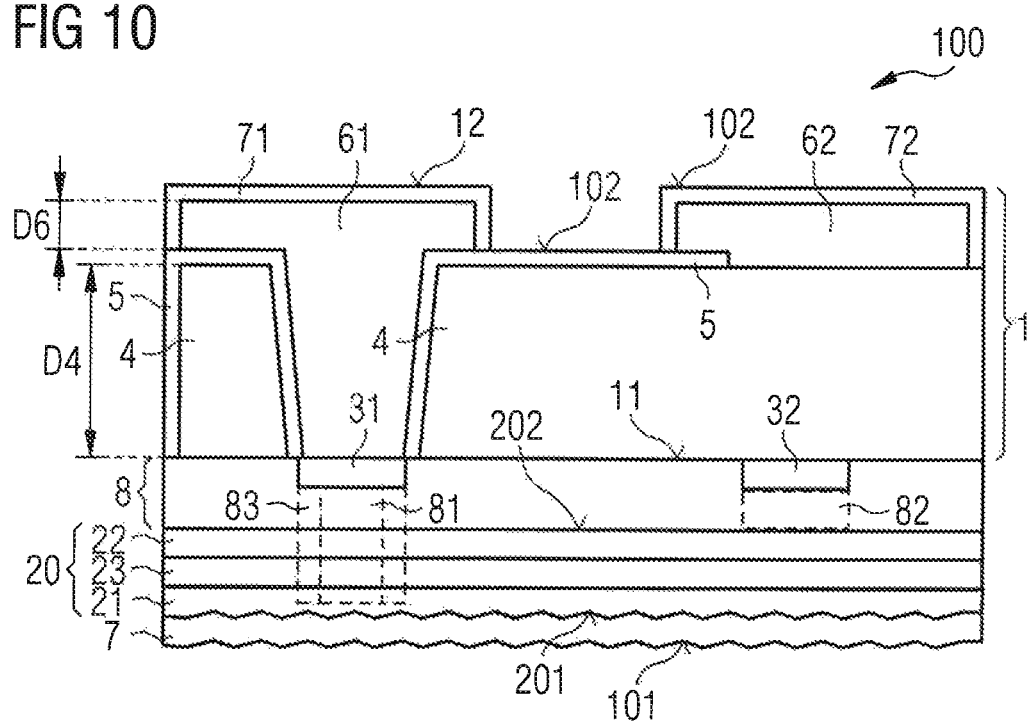

The exemplary embodiment illustrated in FIG. 10 for a component 100 substantially corresponds to the exemplary embodiment illustrated in FIG. 7. In contrast thereto, the wiring structure 8 comprising the connection layer 82, the through-via 81 and the passivation layer 83 is illustrated analogously to FIG. 1C. Furthermore, the carrier 1 is formed in such a way that the carrier layer 4 contributes to the electrical contacting of the semiconductor body 2. In FIG. 10, the carrier 1 has one or a plurality of first through-contacts 61. Instead of the second through-contact, the carrier has a further contact 62 which is formed on the carrier layer 4. In particular, the further contact 62 is electrically conductively connected to the carrier layer 4. At the front side 11, the carrier layer 4 is in electrical contact with the second connection area 32. The further contact 62 can thus be electrically conductively connected to the second connection area 32 via the carrier layer 4, and thus to the connection layer 82 and the second semiconductor layer 22. In comparison to FIG. 5A, the insulating layer 5 in FIG. 10 is formed in a structured manner, so that the further contact 62 is in direct electrical contact for instance with the carrier layer 4.

In contrast to FIG. 10, the carrier 1 can be formed in such a way that at the front side 11, the carrier layer 4 is in electrical contact with the first connection area 31 and in this case is isolated from the second connection area 32.

Figure 11:
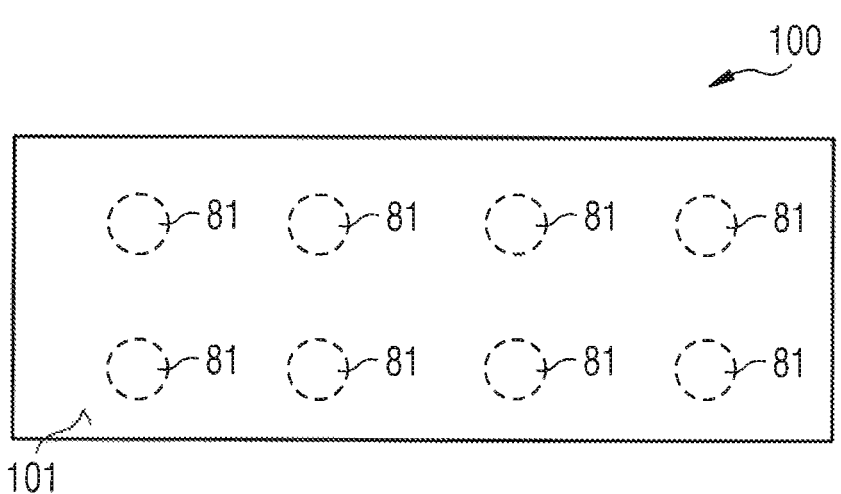

FIG. 11 shows an exemplary embodiment of a component 100 in a plan view of the radiation passage area 101. The component 100 can comprise a plurality of through-vias 81, which—for electrically contacting the first semiconductor layer 21—extend for instance from the second main surface 202 of the semiconductor body throughout the second semiconductor layer 22 and the active layer 23 into the first semiconductor layer 21.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component comprising:
    a carrier being formed exclusively from metal layers and from a metal oxide layer or a plurality of metal oxide layers so the carrier essentially consists of metal and metal oxide or of metals and metal oxides, wherein the carrier comprises a metallic carrier layer, an insulating layer being the metal oxide layer and a first through-contact being one metal layer and extending in a vertical direction throughout the metallic carrier layer, wherein the first through-contact is electrically isolated from the metallic carrier layer via the insulating layer, wherein the metallic carrier layer, the first through-contact and the insulating layer have one identical material from the group consisting of aluminum, copper, nickel and silver;
    a semiconductor body; and
    a wiring structure arranged in the vertical direction between the carrier and the semiconductor body at least in places and configured for electrically contacting the semiconductor body,
    wherein the wiring structure has a first connection area and a second connection area, wherein the connection areas adjoin the carrier and are assigned to different electrical polarities of the component,
    wherein the first through-contact is in electrical contact with one of the connection areas, and
    wherein the component is configured to be externally electrically connectable via the carrier.

2. The component according to claim 1, wherein the metallic carrier layer is one piece.

3. The component according to claim 1, wherein the metallic carrier layer extends along a lateral direction over at least 80% of a lateral edge length of the semiconductor body.

4. The component according to claim 1, wherein the metallic carrier layer, in a plan view of the semiconductor body, covers at least 70% of a main surface of the semiconductor body facing the carrier.

5. The component according to claim 1, wherein the carrier has a metal proportion of at least 90 vol-% and/or wt-%.

6. The component according to claim 1, wherein the metallic carrier layer has a vertical thickness, the first through-contact protrudes in the vertical direction beyond the metallic carrier layer about a vertical height, and wherein the vertical thickness is at least three times as large as the vertical height.

7. The component according to claim 1, wherein the insulating layer is an oxidized metal layer.

8. The component according to claim 1,
    wherein the carrier further comprises a second through-contact,
    wherein the first and second through-contacts are electrically connectable at a rear side of the carrier opposite from a front side,
    wherein the second through-contact extends in the vertical direction through the metallic carrier layer and is electrically isolated from the metallic carrier layer by the insulating layer, and
    wherein, at the front side, the first through-contact is in electrical contact with the first connection area and, at the front side, the second through-contact is in electrical contact with the second connection area.

9. The component according to claim 1,
    wherein the carrier further comprises a second through-contact,
    wherein the first and second through-contacts are electrically connectable at a rear side of the carrier opposite from a front side,
    wherein the second through-contact extends in the vertical direction through the metallic carrier layer and is electrically isolated from the metallic carrier layer by the insulating layer,
    wherein, at the front side, the first through-contact is in electrical contact with the first connection area, and, at the front side, the second through-contact is in electrical contact with the second connection area,
    wherein the first through-contact and the second through-contact comprise an electrically conductive and solderable material, and
    wherein the first and second through-contacts are formed as solder balls protruding over the metallic carrier layer.

10. The component according to claim 1,
    wherein the metallic carrier layer is one piece,
    wherein the first through-contact is completely surrounded in lateral directions by the metallic carrier layer, wherein the carrier has a further contact, which is formed on the metallic carrier layer and is in electrical contact with the metallic carrier layer, and wherein the further contact is electrically conductively connected to one of the connection areas via the metallic carrier layer.

11. The component according to claim 1, wherein the metallic carrier layer, the through-contact and the insulating layer comprise aluminum or nickel.

12. The component according to claim 1, wherein the wiring structure is electrically conductively connected, in part directly, to different semiconductor layers of the semiconductor body.

13. A method for producing a component according to claim 1, wherein the carrier comprises the metallic carrier layer, the insulating layer and the first through-contact, and wherein the carrier is formed on the semiconductor body.

14. The method according to claim 13, wherein the metallic carrier layer is formed on the wiring structure by a galvanic method.

15. The method according to claim 13, wherein the insulating layer is formed on the metallic carrier layer by an electrochemical process.

16. The method according to claim 15, wherein the metallic carrier layer and the insulating layer comprise an identical metal, and wherein the metal of the insulating layer is oxidized by the electrochemical process.

17. A method for producing a plurality of components, wherein each component is the component according to claim 1, wherein a wafer composite is provided which comprises a semiconductor composite and a plurality of metallic carrier layers, wherein the semiconductor composite is divided into a plurality of semiconductor bodies by forming separating trenches, each semiconductor body is assigned to one of the metallic carrier layers, wherein the wafer composite is singulated into the plurality of components along the separating trenches in such a way that each component contains a semiconductor body and a carrier having an associated metallic carrier layer.

18. The method according to claim 17, wherein the metallic carrier layers are mechanically connected to one another by support bars before the wafer composite is singulated, wherein each support bar connects two adjacent metallic carrier layers thereby laterally bridges one of the separating trenches, and wherein the support bars are severed during the singulation process.

19. A component comprising:
a carrier;
a semiconductor body; and
a wiring structure arranged in a vertical direction between the carrier and the semiconductor body at least in places, wherein the wiring structure is configured for electrically contacting the semiconductor body and has a first connection area and a second connection area, the connection areas adjoining the carrier and being assigned to different electrical polarities of the component, wherein the carrier comprises a metallic carrier layer, a first through-contact and a second through-contact, wherein the first through-contact extends in the vertical direction throughout the metallic carrier layer, is electrically isolated from the metallic carrier layer via an insulating layer and is in electrical contact with one of the connection areas at a front side of the carrier facing towards the wiring structure, wherein the second through-contact extends in the vertical direction throughout the metallic carrier layer and is electrically isolated from the metallic carrier layer via the insulating layer, the insulating layer being an oxidized metal layer, wherein the first through-contact and the second through-contact comprise an electrically conductive and solderable material, the first and second through-contacts comprising solder balls protruding over the metallic carrier layer, wherein the component is externally electrically connectable via the carrier, wherein the first and second through-contacts are electrically connectable at a rear side of the carrier opposite from the front side, wherein, at the front side, the first through-contact is in electrical contact with the first connection area and the second through-contact is in electrical contact with the second connection area, and wherein the carrier has a metal proportion of at least 60 vol-% and/or wt-%.

* * * * *